United States Patent
Wang et al.

(10) Patent No.: US 7,838,411 B2
(45) Date of Patent: Nov. 23, 2010

(54) FLUXLESS REFLOW PROCESS FOR BUMP FORMATION

(75) Inventors: Tsing-Chow Wang, Shanghai (CN); Runling Li, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 223 days.

(21) Appl. No.: 11/859,163

(22) Filed: Sep. 21, 2007

(65) Prior Publication Data

US 2008/0128476 A1    Jun. 5, 2008

(30) Foreign Application Priority Data

Dec. 4, 2006   (CN) ......................... 2006 1 0119047

(51) Int. Cl.
*H01L 21/4763* (2006.01)
(52) U.S. Cl. ..................... 438/612; 438/613
(58) Field of Classification Search ............. 438/612, 438/613; 257/E23.021, E21.508
See application file for complete search history.

(56) References Cited

U.S. PATENT DOCUMENTS

| 5,211,328 A | * | 5/1993 | Ameen et al. | .......... 228/180.21 |
| 6,362,087 B1 | * | 3/2002 | Wang et al. | .................. 438/597 |
| 6,689,412 B1 | * | 2/2004 | Bourrieres | .................... 427/58 |
| 6,849,477 B2 | | 2/2005 | Hong et al. | |

FOREIGN PATENT DOCUMENTS

| DE | 3737565 A1 | * | 5/1989 |
| DE | 10127889 A1 | * | 12/2002 |
| JP | 2002178140 A | * | 12/2000 |
| JP | 2006-024659 | * | 1/2006 |
| JP | 2007-149846 | * | 6/2007 |
| WO | WO 2005/022592 A2 | * | 3/2005 |

OTHER PUBLICATIONS

Chinese Office Action of related application mailed Oct. 24, 2008, 4 pgs. without translation.

* cited by examiner

*Primary Examiner*—William M. Brewster
(74) *Attorney, Agent, or Firm*—Squire, Sanders & Dempsey, L.L.P.

(57) ABSTRACT

A fluxless reflow process for bump formation is provided, which includes: a purifying process for keeping solder in a state of melting or half-melting for 40 s to 540 s; a ball-forming process for melting the solder completely to form ball-like bumps; and a cooling process. The splashing of solder can be avoided and the defect that there may be solder balls around the bumps can be eliminated.

30 Claims, 5 Drawing Sheets

FLUXLESS REFLOW PROCESS FOR BUMP FORMATION

This application claims the priority of Chinese Patent Application No. 200610119047.5, filed Dec. 4, 2006, the entire disclosure of which is incorporated herein by reference.

FIELD OF THE INVENTION

The present invention relates to a semiconductor chip package process, and more particularly, to a fluxless reflow process for bump formation.

BACKGROUND OF THE INVENTION

With the development of integrated circuits (ICs), electronic products tend to become more and more smaller in size, more and more intelligent, with a high performance and a high reliability. The smaller dimension and higher integration of IC present a higher requirement to the IC package technique.

The flip chip is a technique in which a chip is flipped over and then connected with a board by solder balls formed on the surface of the chip so as to reduce the package size. The flip chip technology may satisfy the requirement for high performance (such as, high speed, high frequency and smaller pins) with a smaller size. In this way, the product will have a good electric performance and a good heat-conductive property.

Bump fabrication is a key technique in flip-chip technology. The bump is a metal solder ball formed by depositing solder over an interconnection metal layer of a chip and reflowing at a certain temperature. The conventional processes for bump fabrication are shown in FIG. 1A to FIG. 1B. As shown in FIG. 1A, a chip 10 on which surface formed a passivation layer 11 and an interconnection metal layer 12 is provided. An under-bump metallurgy (UBM) layer is formed on the surface of the chip 10. Next, a photoresist layer is coated over the UBM layer, and is subjected to exposure and development so as to form a photoresisit opening. Next, solder for bump 16 is deposited over the photoresist opening. Then the photoresisit layer and part of the UBM layer 13 are removed. Referring to FIG. 1B, flux (not shown) is applied over the surface of the chip, and is reflowed at a certain temperature to form a bump 17. Then, the flux on the bump 17 and over the surface of the chip 10 is removed.

The typical flux consists of colophony resin, active agent, solvent, thixotropic agent and other additives. In the conventional reflow process, the flux is mainly used to remove contaminations on the solder surface, deoxidize metal oxides, and facilitate the reflow. In the conventional reflow process, a bump having a desired shape is formed by using the flux and controlling the temperature of the reflow. The process mainly includes the following stages: a) a pre-heating stage for activating the flux; b) an evaporating stage for evaporating some solvent in the flux and for out-gassing the bubbles in the solder; c) an initially-melting stage for further evaporating the solvent in the flux, in which the flux interacts with the impurities including oxide and metal salt on the solder surface so as to remove the impurities on the solder surface; d) a reflow stage for melting solder at a predetermined temperature; and e) a cooling stage for shaping the melted solder into a ball under its own surface tension.

Since the flux is expensive in price and a cleaning process is also required after bump formation, the above described process wastes the resources, and the cost of the solder bump formation is increased. Moreover, new defects can be introduced during the cleaning process because the flux may react with the flux removing material.

Therefore, a fluxless reflow for solder formation is emerging as a challenging and competitive process. A flip-chip method without flux in the reflow process is disclosed in the Chinese Patent Application No. 02810933, in which the chip and the corresponding substrate are aligned approximately by a contact pressure before bump reflowing, therefore the flux is not necessary for joining the chip to the substrate. However, the above method can only be used to the reflow in chip interconnection. Up to now, a fluxless reflow process for bump formation has not been presented.

The flux is used to deoxidize the metal oxide and cover the melted solder in a conventional reflow process. In a fluxless reflow process, bubbles may be caused by the evaporating of organic material in solder. As a result, the solder may be splashed and then form solder balls around the bumps during the reflow.

SUMMARY OF THE INVENTION

The present invention is to solve such a problem that solder may be splashed and form solder balls around bumps during a fluxless reflow process in the prior art.

The embodiments of the present invention provide a fluxless reflow process for bump formation, which includes the following steps: a purifying process for keeping solder in a melting or half-melting state for 40 seconds (s) to 540 s; a ball-forming process for melting the solder completely to form ball-like bumps; and a cooling process.

Wherein, in the purifying process, the temperature for keeping solder in a melting or half-melting state is no less than Tc−4° C. and no more than Tc+4° C., in which Tc is the melting point of the solder.

Further, the purifying process is a process in which the temperature increases from Tc−4° C. to Tc+4° C. Further, the purifying process includes one or more temperature-constant stages, each of the stages has a duration of 40 s to 180 s. Moreover, the temperatures in the temperature-constant stages are linear with each other.

Preferably, the purifying process includes three temperature-constant stages, each of the stages has a duration of 40 s to 180 s. More preferably, the temperatures in the three temperature-constant stages are linear with each other.

More preferably, the temperature of the first temperature-constant stage is Tc−2° C., the temperature of the second temperature-constant stage is Tc, and the temperature of the third temperature-constant stage is Tc+2° C.

Wherein, in the ball-forming process, the temperature for melting the solder completely to form ball-like bumps is no less than Tc+15° C. and no more than Tc+65° C., and the time required for the ball-forming process is 40 s to 180 s.

Wherein, the purifying and the ball-forming processes are performed in an atmosphere of deoxidizing gas. Preferably, the deoxidizing gas is hydrogen gas or formic acid gas.

Wherein, the cooling process is performed in an atmosphere of deoxidizing gas or inert gas or nitrogen gas.

The embodiments of the invention also provide another fluxless reflow process for bump formation, the process includes:

1. a first reflow, including the following steps: a purifying process for keeping solder in a melting or half-melting state for 40 s to 540 s; a ball-forming process for melting the solder completely to form ball-like bumps; and a cooling process;

2. a first bump cleaning; and 3. a second reflow, including the following steps: a purifying process for keeping solder in a melting or half-melting state for 40 s to 540 s; a ball-forming process for melting the solder completely to form ball-like bumps; and a cooling process;

Wherein, the first bump cleaning includes removing residues on bumps by acid reagent and cleaning bumps with deionized water.

Wherein, the acid reagent is methanesulfonic acid, acetic acid or formic acid.

Moreover, the fluxless reflow process for bump formation further includes a second bump cleaning after the second reflow. The second bump cleaning includes cleaning bumps with deionized water and spin-drying the bumps.

The invention has the following advantages over the prior art:

1. In the embodiments of the present invention, the reflow process has been divided into three steps, and the solder keeps in a melting or half-melting state for 120 s-540 s during the first purifying process, so that the escapable organic material in the solder and the gas molecules contained therein may escape slowly, thus splashing can be avoided in the following ball-forming process and the problem of forming solder balls around bumps can also be avoided.

2. In the embodiments of the present invention, the purifying process is a process in which the temperature increases from Tc−4° C. to Tc+4° C., so that the impurities and evaporable materials in the solder can escape from the solder effectively without splashing.

3. In the embodiments of the present invention, the purifying process includes three temperature-constant stages each having a duration of 40 s to 180 s. As a result, the operation parameter of the apparatus can be set easily and the processes may be simplified.

4. The embodiments of the present invention also provide another fluxless reflow process for bump formation including: a first reflow; a first bump cleaning after the first reflow for removing residual organic metal salt and oxide on the surface of bumps as well as other contaminations which have not been removed in the first reflow; and a second reflow for repairing the surfaces of bumps which are rough due to many ostioles resulted from the first cleaning which do not meet the requirement of quality, in order to form the bumps with smooth surfaces and desirable shapes.

DETAILED DESCRIPTION OF THE INVENTION

The embodiments of the present invention will be described below with reference to the drawings.

Figure 1A:
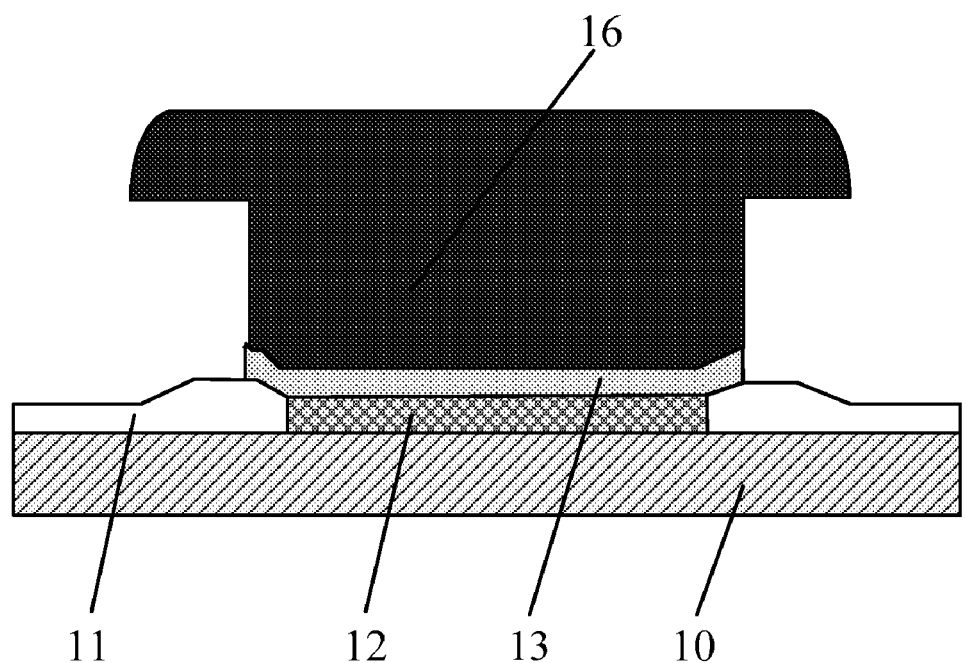
FIG. 1A-1B are schematic cross-sectional diagrams of a bump formation process in the prior art.
Figure 1B:
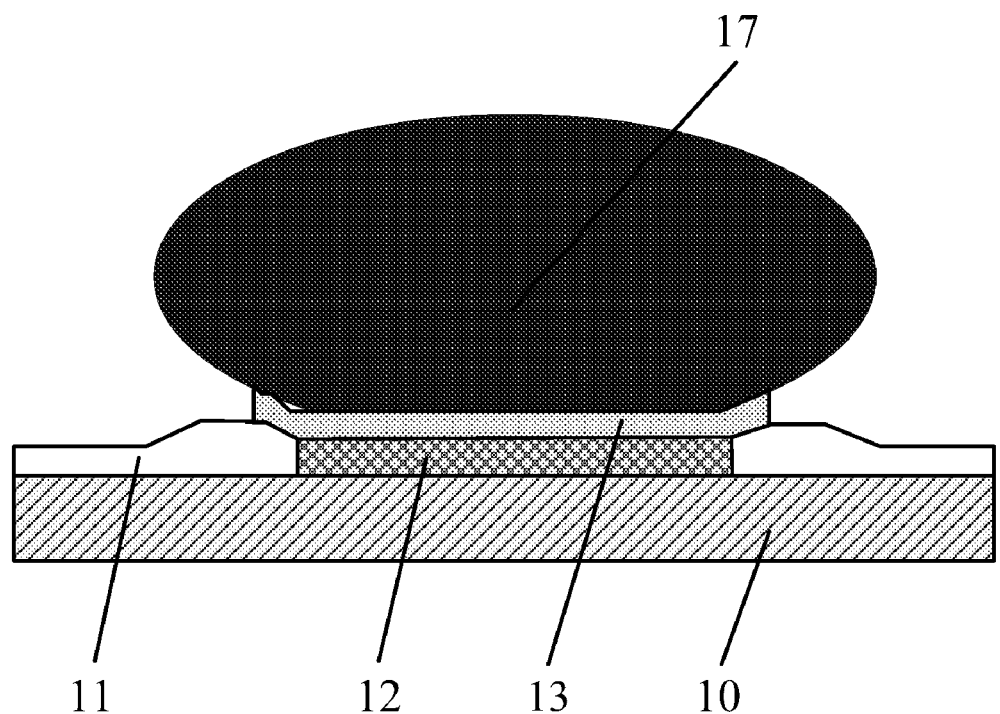
Figure 2:
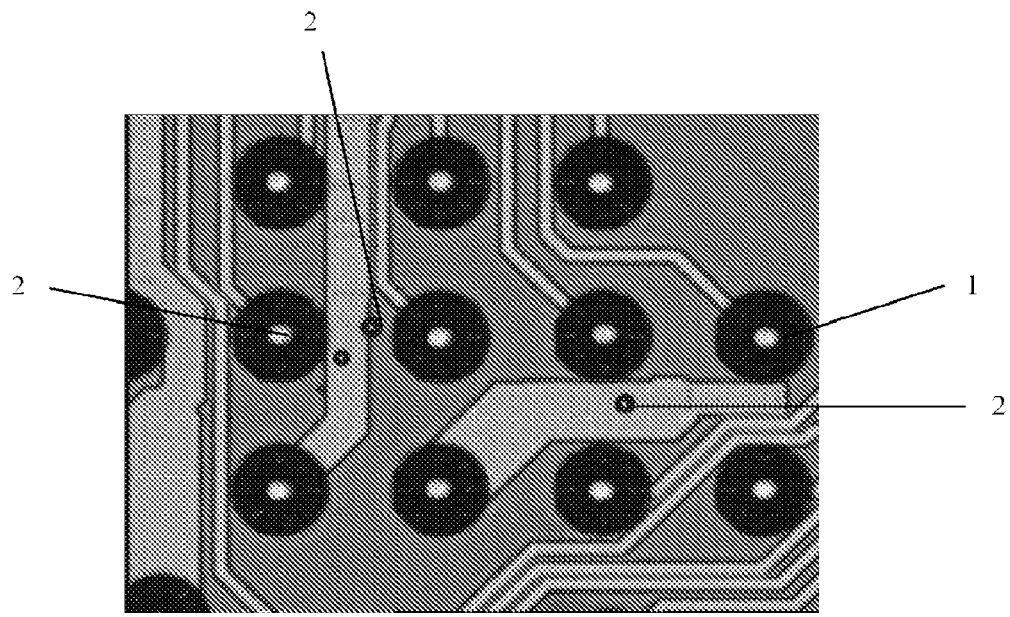
FIG. 2 is the surface topography of a chip with bump balls formed on its surface in the prior art.

The price of flux is high, a cleaning process is required after the utilization of flux, and defects may be caused by the cleaning process, thus, the fluxless reflow process has become a valuable research work in semiconductor industry. However, the flux is used to deoxidize the metal oxides and cover the melting solder in a conventional reflow process, while in a fluxless reflow process, bubbles may be caused by the evaporation of organic material in the solder, thus the solder may splash and then form solder balls around the bumps. As shown in FIG. 2, the reference number 1 represents a normal bump and the reference number 2 represents a solder ball formed by splashing. Such a solder ball may cause current leakage, electrical noise and even a short circuit between two adjacent elements (such as wires, pads, pins and bumps etc.) in a chip or a circuit board, thus resulting in a long-term problem of reliability. In addition, the element(s) near the solder ball will be affected during the processing of such a solder ball.

A fluxless reflow process for bump formation is provided in an embodiment of the invention, the process includes the following steps: a purifying process for keeping the solder in a melting or half-melting state for 40 s to 540 s; a ball-forming process for melting the solder completely to form a ball-like bump; and a cooling process.

The fluxless reflow process for bump formation mentioned above should be performed in an atmosphere of deoxidizing gas so as to ensure that the alloy solder will not be oxidized during the process while part of oxide contaminations in the alloy solder can be removed. Preferably, the deoxidizing gas is hydrogen gas or formic acid gas.

The solder described in the present invention may be any alloy material which can be used to form a bump, for example, the solder containing lead such as an eutectic lead-tin alloy (37 wt % Pb, 63 wt % Sn) and a lead-tin alloy with a high content of lead (95% Pb, 5 wt % Sn or 97% Pb, 3 wt % Sn), or the solder without lead such as silver-tin alloy, tin-copper alloy, tin-gold ally and silver-tin-copper alloy.

In order to maintain the solder in a state of melting or half-melting, the temperature of the solder should be in the proximity of the eutectic point of the alloy. As can be seen from many experiments, provided that the melting point of solder is Tc(° C.) and the temperature of the solder is $T_1$, then when Tc−4° C.≦$T_1$≦Tc+4° C., the solder may be kept in a state of melting or half-melting. In the embodiments of the present invention, the solder is kept in a state of melting or half-melting for 40 s to 540 s so as to enable the evaporable contaminations and bubbles in the solder to escape completely. The contaminations in the solder can be reduced by the above described purifying process. The duration of the purifying process depends on the content of contaminations in the solder and the uniformity of metal phase. The higher the content of contaminations is, the less the uniformity of metal phase is, the longer the duration time needed is. A longer time facilitates the organic contaminations to migrate onto the surface of the melting solder so as to form a uniform metal phase, with the result of a desirable bump. However, the time for purifying cannot be too long, in order to avoid the crystal whisker of tin. Hence, in the embodiments of the present invention, the time required for purifying is 40 s-540 s, preferably 120 s-450 s, more preferably 180-360 s. Particularly, the time can be, for example, 80 s, 150 s, 200 s, 270 s, 300 s, 420 s and 480 s, in order to enable the contaminations and bubbles in the solder to escape completely.

Figure 3:
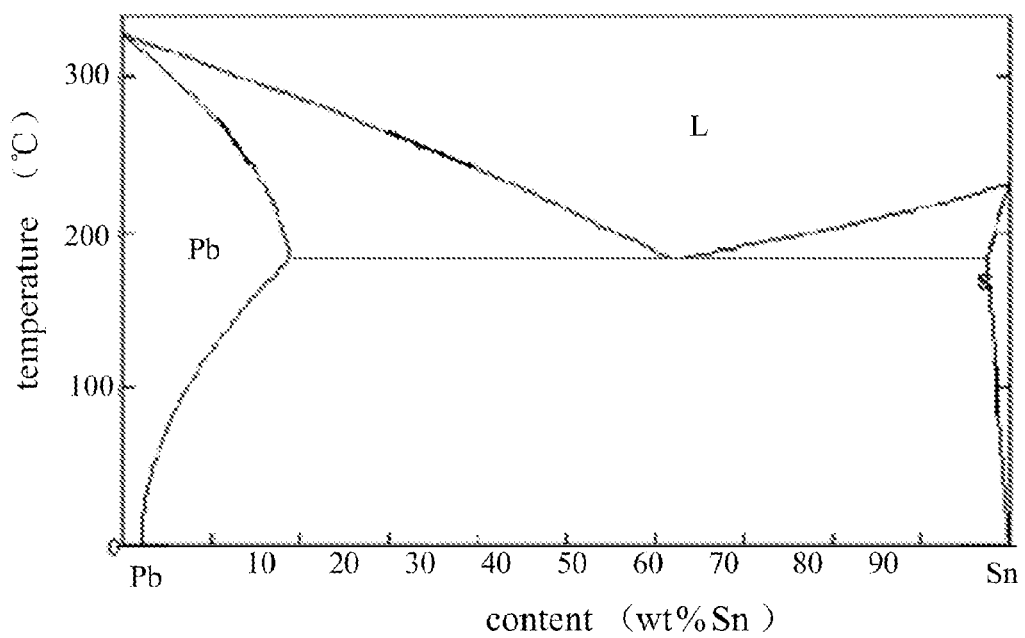
FIG. 3 is the phase diagram of lead-tin alloy.

FIG. 3 is a phase diagram of a lead-tin alloy. As shown in FIG. 3, the eutectic point of eutectic lead-tin alloy (37% Pb, 63 wt % Sn) is 183° C. Therefore, the lead-tin alloy can be maintained in a state of melting or half melting without splashing solder by keeping the environment temperature at 179-187° C. for 40-540 s in an embodiment of the present invention. During this process, the various evaporable organic salts contained in the lead-tin alloy solder, such as the organic lead and organic tin generated by lead and tin combined with various organic molecules, other evaporable organic materials, and other gas molecules in the lead-tin alloy solder, evaporate slowly from the melting lead-tin alloy. Since the alloy is in a melting or half-melting state and the evaporation is slow, splashing will not be caused. The oxides contained in the surface of the solder, such as lead oxide and tin oxide, will be deoxidized by the weak acid gas, such as formic acid gas, in the environment during the process.

Preferably, the purifying process in an embodiment of the invention is a procedure in which the temperature increases from Tc−4° C. to Tc+4° C. gradually, thus the contaminations and evaporable materials in the solder can evaporate from the solder more effectively without splashing.

To combine the fluxless reflow process for bump formation according to the embodiments of the present invention with the commercial available reflow equipments, the above purifying process can be divided into at least one temperature-constant stage depending on the characteristics of various reflow equipments, and the total time of the stages is 40 s-540 s. Preferably, the temperatures of the temperature-constant stages in the purifying process increases. More preferably, the duration of each temperature-constant stage is 40 s-180. Further, when the number of the temperature-constant stages in the purifying process is larger than or equal to two, the temperatures in the different temperature-constant stages are in a linear relationship, i.e., temperatures in the different temperature-constant stages increase uniformly.

More preferably, the purifying process may be divided into three temperature-constant stages each having a duration of 40 s-180 s. More preferably, the temperatures in the three temperature-constant stages increase linearly. More preferably, the durations of the temperature-constant stages is equal with each other. For example, the temperature of the first temperature-constant stage may be Tc−2° C., the temperature of the second temperature-constant stage may be Tc, and the temperature of the third temperature-constant stage may be Tc+2° C. The duration of each temperature-constant stage may be t, wherein t is no less than 40 s and no more than 180 s. The duration and temperature for a stage are set to be the same, so that the operation parameter of the apparatus can be set easily.

Figure 4:
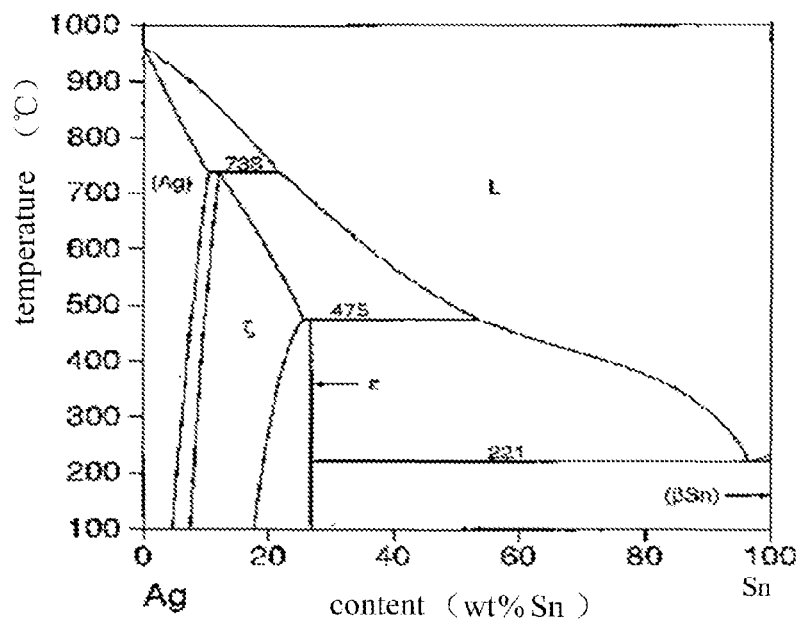
FIG. 4 is the phase diagram of silver-tin alloy.

FIG. 4 is a phase diagram of a silver-tin alloy, wherein, for example, the mass percentage of silver in the alloy is 2.5±0.5%, and the mass percentage of tin in the alloy is 97.5±0.5%. As shown in FIG. 4, the eutectic point of the eutectic silver-tin alloy is 217° C. Hence, the purifying process is performed with an environment temperature of 213° C.-221° C. in the embodiment of the invention. Preferably, the purifying process can be divided into three temperature-constant stages: a first temperature-constant stage of 215° C. with a duration of 120 s; a second temperature-constant stage of 217° C. with a duration of 120 s; and a third temperature-constant stage of 219° C. with a duration of 120 s.

After the purifying process, a ball-forming process follows for melting the solder completely to form a ball-like bump. Wherein, the temperature from the purifying process to the ball-forming process bumps should be increased as fast as possible, and the total time required for increasing temperature should be less than 60 s. In this stage, the temperature for forming bumps depends on the properties and contents of the alloys. For a conventional alloy, the temperature required for melting the solder completely and forming a ball-like bump belongs to the prior art. Those skilled in the art can find a temperature range for forming bumps with solder without any creative work. The present invention will not give any restriction to this. However, in a preferred embodiment according to the present invention, in accordance with the experience data and experiment data for forming bumps with various solder, if a temperature for melting the solder completely and forming ball-like bumps in above fluxless reflow process is $T_2$, then $T_c+15°$ C.$\leq T_2 \leq T_c+65°$ C., and the duration is 40-180 s.

The solder forms liquid bumps with a ball-like shape after the above ball-forming process. Then, a cooling process is performed to form solid bumps with a ball-like shape and smooth surface. The cooling process should be performed in an atmosphere without oxygen, such as a nitrogen atmosphere, so as to prevent the bumps from being oxidated. The present invention has no particular limitation on the cooling process, the temperature of the bumps can be lowered to below 100° C. in a natural condition.

EMBODIMENT 1

Figure 5:
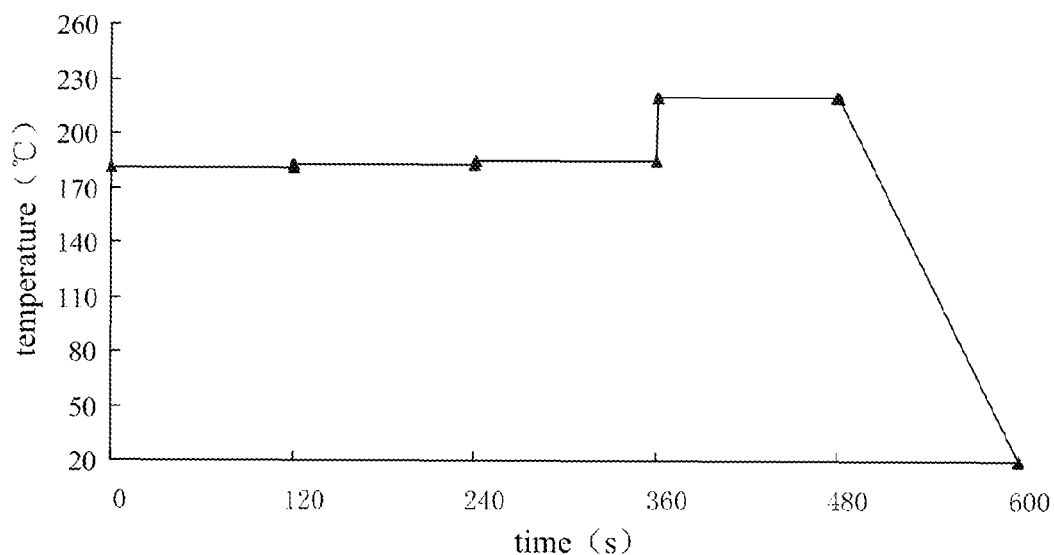
FIG. 5 is a reflow temperature profile according to embodiment 1 of the present invention.

FIG. 5 shows a temperature profile of the eutectic lead-tin alloy (37 wt % Pb, 63 wt % Sn) according to the embodiment 1 of the present invention. In the preferred embodiment of the present invention, the eutectic lead-tin alloy is employed. The purifying process is divided into three temperature-constant stages, the temperatures of which are 181° C., 183° C. and 185° C. respectively, each having a duration of 120 s. The purifying process is performed in an atmosphere of formic acid gas. Next, the eutectic lead-tin alloy is reflowed at a temperature of 220° C. for 100 s in an atmosphere of formic acid gas. Then, the temperature is lowered to the room temperature naturally in a nitrogen atmosphere to form a bump of eutectic lead-tin alloy.

EMBODIMENT 2 TO EMBODIMENT 4

For the detailed process parameters in embodiments 2 to 4, refer to the above description of embodiment 1. The detailed process parameters are as shown in table 1.

TABLE 1

The detailed process parameters of the eutectic lead-tin alloy in embodiments 2 to 4

| | The purifying process | | | | | | The ball-forming process | | The cooling process | |
|---|---|---|---|---|---|---|---|---|---|---|
| | Stage 1 | | Stage 2 | | Stage 3 | | | | | |
| embodiment | Temperature (° C.) | time (s) | Temperature (° C.) | time (s) | Temperature (° C.) | time (s) | Temperature (° C.) | time (s) | Temperature (° C.) | Atmosphere |
| embodiment 2 | 179 | 120 | 181 | 140 | 183 | 160 | 210 | 120 | 20 | nitrogen |
| embodiment 3 | 180 | 100 | 183 | 120 | 185 | 140 | 220 | 100 | 25 | |
| embodiment 4 | 183 | 80 | 185 | 100 | 187 | 120 | 240 | 80 | 25 | |

EMBODIMENT 5 TO EMBODIMENT 7

For example, a silver-tin alloy with 2.5 wt % Ag and 97.5 wt % Sn is used to form bumps of the silver-tin alloy.

The detailed process parameters are as shown in table 2.

TABLE 2

The detailed process parameters of silver-tin alloy with 2.5 wt % Ag and 97.5 wt % Sn in embodiments 5 to 7

| | The purifying process | | | | | | The ball-forming process | | The cooling process | |
| --- | --- | --- | --- | --- | --- | --- | --- | --- | --- | --- |
| | Stage 1 | | Stage 2 | | Stage 3 | | | | | |
| embodiment | Temperature (° C.) | time (s) | Temperature (° C.) | time (s) | Temperature (° C.) | time (s) | Temperature (° C.) | time (s) | Temperature (° C.) | atmosphere |
| embodiment 5 | 217 | 50 | 219 | 180 | 221 | 90 | 235 | 90 | 25 | nitrogen |
| embodiment 6 | 215 | 60 | 217 | 110 | 219 | 130 | 250 | 60 | 25 | |
| embodiment 7 | 213 | 140 | 215 | 100 | 217 | 160 | 260 | 45 | 25 | |

For most types of solder, bumps with a smooth surface and without bubbles can be formed by the above reflow process. During this fluxless reflow process for bump formation, no splashing occurs and no solder balls are formed around the bumps.

For some types of solder with a high content of contamination, however, there may still be some un-evaporated material and oxide, such as organic metal, on the surface of the bumps after one reflow process described above. Hence, it may cause the bumps with rough surfaces or the bumps with undesirable shapes. Such rough-surfaced or shape-undesirable bumps need further processing, so that the bumps may have smooth surfaces and desirable shapes.

In order to remove the contamination in the solder of lead-tin alloy during the reflow process, the embodiments of the present invention provide another fluxless reflow process for bump formation, in which the reflow process is performed several times, which includes the following steps:

1. a first reflow which includes the following steps: a purifying process for keeping the solder in a state of melting or half-melting for 40 s to 540 s; a ball-forming process for melting the solder completely to form ball-like bumps; and a cooling process;

2. a first bump cleaning;

3. a second reflow which includes the following steps: a purifying process for keeping the solder in a state of melting or half-melting for 40 s to 540 s; a ball-forming process for melting the solder completely to form ball-like bumps; and a cooling process.

Figure 6:
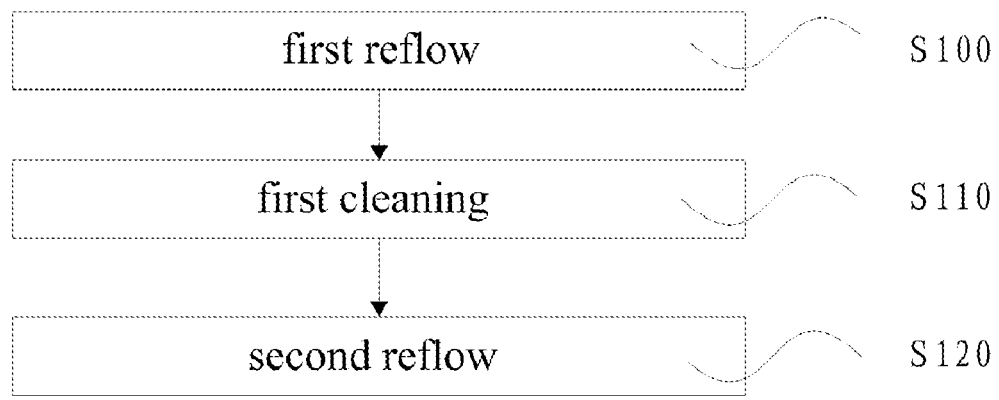
FIG. 6 is a flow chart of a process with several reflows according to an embodiment of the present invention.

Refer to FIG. 6 which is a flow chart of the fluxless reflow process according to the embodiments of the present invention. Firstly, a first reflow is performed (S100), this first reflow may be any one selected from the single reflow processes described in the present invention, preferably, may be any one selected from embodiment 1 to embodiment 7. Bumps are formed after the first reflow, however, organic metal contaminations may cover the surface of the bumps.

Referring to FIG. 6, a first cleaning is performed (S110). Firstly, the bumps which have been subjected to the first reflow are cleaned by use of an acid reagent, such as methanesulfonic acid, acetic acid or formic acid, etc. The rough oxide layer or the contaminations on the surface of the bumps can be removed by the first cleaning process. Then, the bumps are cleaned with deionized water so as to remove the residues of cleaning reagent on the solder surface.

Since the surface of the bumps may become rougher after cleaning by use of an acid reagent such as methanesulfonic acid, a second reflow process is needed to form the bumps with a smooth surface and a high quality, as shown in FIG. 6. The second reflow process may be any one selected from the single reflow processes described in the invention, preferably, may be any one selected from embodiment 1 to embodiment 7.

Figure 7:
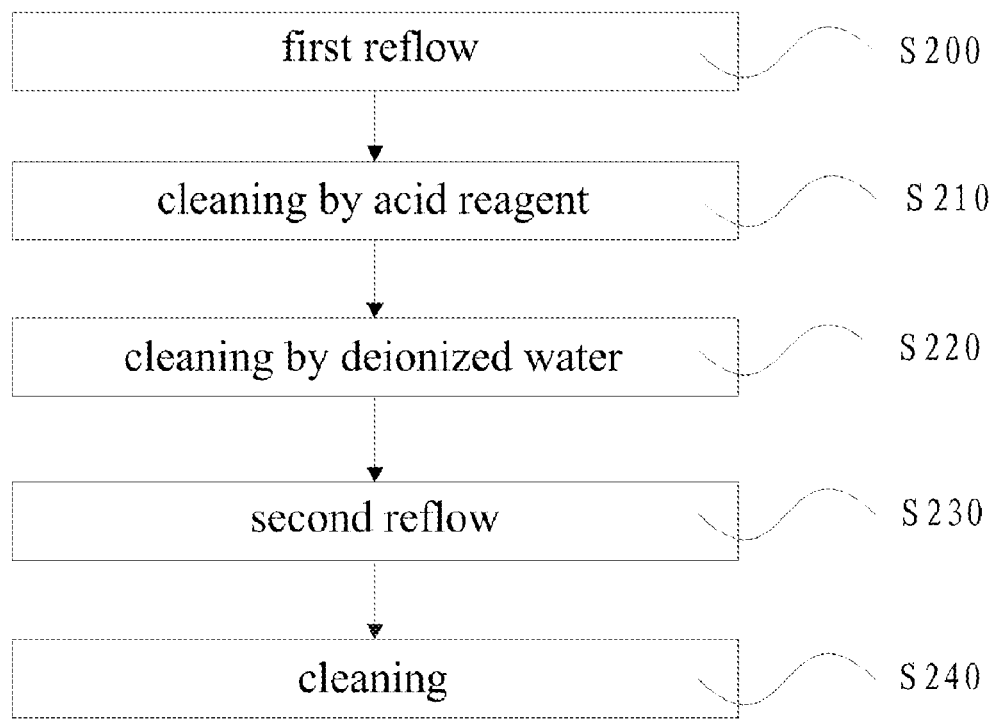
FIG. 7 is a flow chart of another process with several reflows according to an embodiment of the present invention.

A process with several reflows according to an embodiment of the present invention is described below with reference to FIG. 7. Firstly, a first reflow is performed (S200), wherein, an eutectic lead-tin alloy is employed, a purifying process is divided into three temperature-constant stages with reference to the temperature profile of the eutectic lead-tin alloy (37 wt % Pb, 63 wt % Sn). The temperatures of the three temperature-constant stages are 180° C., 183° C. and 186° C. respectively and the duration of each temperature-constant stage is 125 s. Next, the eutectic lead-tin alloy is melted and formed into balls at a temperature of 230° C. Then, a cooling process is performed in an atmosphere of nitrogen to lower the temperature to below 20° C., hence, the bumps of the eutectic lead-tin alloy are formed.

Next, a first cleaning is performed (S210) by use of formic acid reagent, so as to remove lead oxide and tin oxide on the surface of the bumps. The bumps are then cleaned with deionized water to remove the residues of formic acid on the surface of the bumps.

Then, a second reflow is performed (S220), wherein a purifying process is divided into three temperature-constant stages, the temperatures of the three temperature-constant stages are 180° C., 182° C. and 184° C. respectively and the duration of each temperature-constant stage is 80 s. Next, the eutectic lead-tin alloy solder is reflowed at a temperature of 225° C. Then, a cooling process is performed in an atmosphere of nitrogen to lower the temperature to below 20° C., hence, the bumps of the eutectic lead-tin alloy are formed.

After the second reflow process, a second cleaning is performed (S230) if any contamination attaches on the surface of the lead-tin alloy bumps. The bumps are cleaned with deionized water and are then dried.

Figure 8:
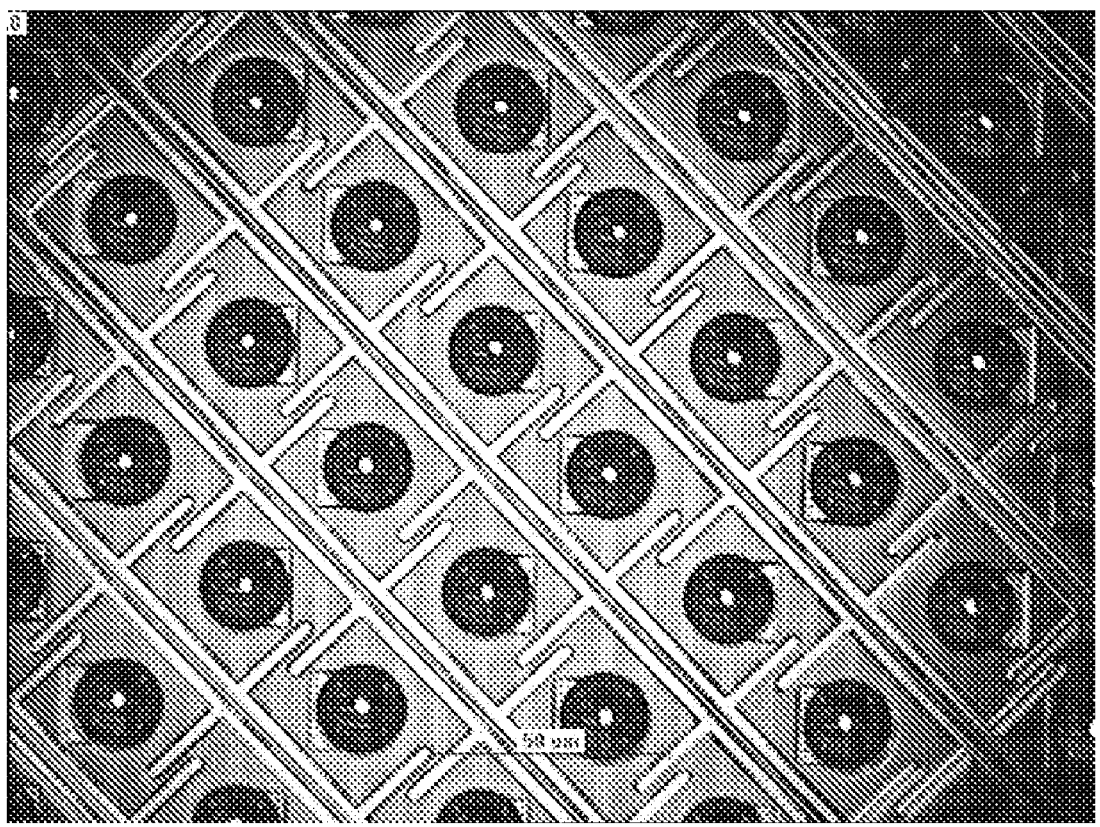
FIG. 8 is the surface topography of bumps formed by the process according to an embodiment of the invention.

As shown in FIG. 8, the bumps fabricated by the above process have a smooth surface and there is no solder ball around the bumps, which satisfy the requirement of semiconductor industry.

While the preferred embodiments of the present invention have been described as above, it shall be appreciated that the scope of the present invention shall not be limited thereto. Those skilled in the art can recognize various variations and modifications to the embodiments without departing from the scope of the present invention. Thus, it is intended that the scope of the present invention shall be as defined in the claims.

What is claimed is:

1. A fluxless reflow process for bump formation, comprising:
- a purifying process for keeping a solder alloy in a melting or half-melting state for 40 seconds (s) to 540 s by maintaining the temperature of the solder alloy being in the proximity of the eutectic point of the solder alloy, wherein the purifying process includes
- three temperature-constant stages, the temperature of the first temperature-constant stage is Tc−2° C., the temperature of the second temperature-constant stage is Tc, and the temperature of the third temperature-constant stage is Tc+2° C., in which Tc is the melting point of the solder;
- a ball-forming process for melting the solder completely to form ball-like bumps; and a cooling process.

2. The process according to claim 1, wherein the purifying process is a procedure in which the temperature increases from Tc−4° C. to Tc+4° C.

3. The process according to claim 2, wherein the purifying process includes at least one temperature-constant stage, each having a duration of 40 s to 180 s.

4. The process according to claim 3, wherein the temperatures in more than one temperature-constant stages of the purifying process present a linear relationship.

5. The process according to claim 4, wherein the purifying process includes said three temperature-constant stages, each having a duration of 40 s to 180 s.

6. The process according to claim 1, wherein the temperature required for melting the solder completely to form a ball-like bump is no less than Tc+15° C. and no more than Tc+65° C.

7. The process according to claim 1, wherein the duration of the ball-forming process is 40 s to 180 s.

8. The process according to claim 1, wherein the purifying process and the ball-forming process are performed in an atmosphere of deoxidizing gas and the cooling process is performed in an atmosphere of deoxidizing gas or inert gas or nitrogen gas.

9. The process according to claim 1, wherein the purifying process and the ball-forming process are performed in an atmosphere of deoxidizing gas and the cooling process is performed in an atmosphere of deoxidizing gas or inert gas or nitrogen gas.

10. The process according to claim 2, wherein the purifying process and the ball-forming process are performed in an atmosphere of deoxidizing gas and the cooling process is performed in an atmosphere of deoxidizing gas or inert gas or nitrogen gas.

11. The process according to claim 3, wherein the purifying process and the ball-forming process are performed in an atmosphere of deoxidizing gas and the cooling process is performed in an atmosphere of deoxidizing gas or inert gas or nitrogen gas.

12. The process according to claim 4, wherein the purifying process and the ball-forming process are performed in an atmosphere of deoxidizing gas and the cooling process is performed in an atmosphere of deoxidizing gas or inert gas or nitrogen gas.

13. The process according to claim 5, wherein the purifying process and the ball-forming process are performed in an atmosphere of deoxidizing gas and the cooling process is performed in an atmosphere of deoxidizing gas or inert gas or nitrogen gas.

14. The process according to claim 1, wherein the purifying process and the ball-forming process are performed in an atmosphere of deoxidizing gas and the cooling process is performed in an atmosphere of deoxidizing gas or inert gas or nitrogen gas.

15. The process according to claim 6, wherein the purifying process and the ball-forming process are performed in an atmosphere of deoxidizing gas and the cooling process is performed in an atmosphere of deoxidizing gas or inert gas or nitrogen gas.

16. The process according to claim 7, wherein the purifying process and the ball-forming process are performed in an atmosphere of deoxidizing gas and the cooling process is performed in an atmosphere of deoxidizing gas or inert gas or nitrogen gas.

17. The process according to claim 8, wherein the deoxidizing gas is hydrogen gas or formic acid gas.

18. The process according to claim 9, wherein the deoxidizing gas is hydrogen gas or formic acid gas.

19. The process according to claim 10, wherein the deoxidizing gas is hydrogen gas or formic acid gas.

20. The process according to claim 11, wherein the deoxidizing gas is hydrogen gas or formic acid gas.

21. The process according to claim 12, wherein the deoxidizing gas is hydrogen gas or formic acid gas.

22. The process according to claim 13, wherein the deoxidizing gas is hydrogen gas or formic acid gas.

23. The process according to claim 14, wherein the deoxidizing gas is hydrogen gas or formic acid gas.

24. The process according to claim 15, wherein the deoxidizing gas is hydrogen gas or formic acid gas.

25. The process according to claim 16, wherein the deoxidizing gas is hydrogen gas or formic acid gas.

26. A fluxless reflow process for bump formation, comprising:
- a first reflow comprising purifying process for keeping a solder alloy in a melting or half-melting state for 40 s to 540 s, by maintaining the temperature of the solder alloy being in the proximity of the eutectic point of the solder alloy, wherein the purifying process includes
- three temperature-constant stages, the temperature of the first temperature-constant stage is Tc−2° C., the temperature of the second temperature-constant stage is Tc, and the temperature of the third temperature-constant stage is Tc+2° C., in which Tc is the melting point of the solder; a ball-forming process for melting the solder completely to form ball-like bumps; and a cooling process;
- a first bump cleaning; and
- a second reflow which repeats the first reflow once more.

27. The process according to claim 26, wherein the first bump cleaning comprises removing residues on bumps by use of acid reagent and cleaning the bumps with deionized water.

28. The process according to claim 27, wherein the acid reagent is methanesulfonic acid, acetic acid or formic acid.

29. The process according to claim 26, wherein the fluxless reflow process for bump formation further comprises a second bump cleaning after the second reflow.

30. The process according to claim 29, wherein the second bump cleaning includes cleaning bumps with deionized water and drying the bumps.

* * * * *